United States Patent
Shim et al.

(10) Patent No.: US 11,769,435 B2
(45) Date of Patent: Sep. 26, 2023

(54) DEFORMED DISPLAY DEVICE

(71) Applicant: LG Display Co., Ltd., Seoul (KR)

(72) Inventors: Da-Hye Shim, Paju-si (KR); Eui-Hyun Chung, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 135 days.

(21) Appl. No.: 17/536,914

(22) Filed: Nov. 29, 2021

(65) Prior Publication Data
US 2022/0180785 A1    Jun. 9, 2022

(30) Foreign Application Priority Data
Dec. 7, 2020    (KR) .......................... 10-2020-0169569

(51) Int. Cl.
*G09G 3/20*    (2006.01)
*H01L 29/786*    (2006.01)

(52) U.S. Cl.
CPC ....... *G09G 3/20* (2013.01); *G09G 2300/0413* (2013.01); *G09G 2300/0426* (2013.01); *G09G 2300/0452* (2013.01); *G09G 2300/0819* (2013.01); *G09G 2300/0842* (2013.01); *G09G 2300/0861* (2013.01); *G09G 2320/0233* (2013.01); *H01L 29/7869* (2013.01)

(58) Field of Classification Search
CPC ............. G09G 3/20; G09G 2300/0413; G09G 2300/0426; G09G 2300/0452; G09G 2300/0819; G09G 2300/0842; G09G 2300/0861; G09G 2320/0233; H01L 29/7869

See application file for complete search history.

(56) References Cited

U.S. PATENT DOCUMENTS

| | | | |
|---|---|---|---|
| 8,368,618 B2 | 2/2013 | Choi | |
| 2010/0156762 A1 | 6/2010 | Choi | |
| 2021/0088797 A1* | 3/2021 | Uragami | .............. H04N 13/395 |
| 2021/0090496 A1* | 3/2021 | Yue | ........................ G09G 3/3225 |
| 2021/0090961 A1* | 3/2021 | Tanemura | .......... H01L 29/78648 |
| 2021/0091120 A1* | 3/2021 | Xie | ..................... H01L 27/1225 |
| 2021/0091158 A1* | 3/2021 | Kasahara | ............. G09G 3/3233 |

FOREIGN PATENT DOCUMENTS

| | | |
|---|---|---|
| KR | 10-1056241 B1 | 8/2011 |
| KR | 10-2019-0024330 A | 3/2019 |

* cited by examiner

*Primary Examiner* — Sejoon Ahn
(74) *Attorney, Agent, or Firm* — Fenwick & West LLP

(57) ABSTRACT

A deformed display device includes a display area including a plurality of pixel array areas in which a plurality of pixel array groups are arranged and a plurality of circuit areas in which a plurality of driving circuits are arranged, wherein the pixel array groups and the driving circuits form a pixel block; and a dummy area disposed at one side of the display area and including a plurality of dummy pixel array areas in which a plurality of dummy pixel array groups are arranged and a plurality of dummy circuit areas in which a plurality of dummy circuits are arranged, wherein the dummy pixel array groups and the dummy circuits do not form the pixel block.

20 Claims, 10 Drawing Sheets

DEFORMED DISPLAY DEVICE

CROSS-REFERENCE TO RELATED APPLICATION

The present application claims priority from and the benefit under 35 U.S.C § 119(a) of Korean Patent Application No. 10-2020-0169569 filed in the Republic of Korea on Dec. 7, 2020, which is hereby incorporated by reference in its entirety.

BACKGROUND

Technical Field

The present disclosure relates to a deformed display device using a gate-in-panel (GIP) circuit.

Discussion of the Related Art

Recently, with entering into a full-fledged information age, there is a growing interest in information display dealing with and displaying mass information. In response to this, various flat panel display devices have been developed and have been in the spotlight.

Specific examples of the flat panel display devices include liquid crystal display (LCD) devices, plasma display panel (PDP) devices, field emission display (FED) devices, electroluminescence display (ELD) devices, organic light-emitting diode display (OLED) devices. The flat panel display devices show excellent performance of thin thickness, light weight, and low power consumption and have rapidly replaced cathode ray tube (CRT).

In the process of developing technologies for implementing these display devices in recent years, a technology for implementing a design desired by a consumer is also required for a display device beyond a technology for displaying an image.

One of the technologies is diversification of the shape of a display area. The display area is an area in which pixels substantially emit light to display an image, and various shapes may be required instead of a rectangular shape.

Here, the display device requiring the diversification of the shape of the display area can be applied to various fields such as televisions, automobile displays, wearable devices, etc. as well as mobile devices of smartphones or tablet PCs.

Accordingly, the technologies of deformed display devices have been researched to satisfy the needs of consumers by diversifying the shape of the display area of the display device for various purposes and securing the flexibility of product designs.

In particular, recently, in the process of diversifying the shape of the display area, the research on a deformed display device having a narrow bezel has been actively conducted.

SUMMARY

Accordingly, embodiments of the present disclosure are directed to a deformed display device that substantially obviates one or more of the problems due to limitations and disadvantages of the related art.

An aspect of the present disclosure is to provide a deformed display device that can implement a narrow bezel by reducing a width of the bezel in a display device using a GIP circuit.

Another aspect of the present disclosure is to provide a deformed display device with improved uniformity of driving characteristics.

Another aspect of the present disclosure is to provide a deformed display device that prevents deterioration of display quality in a dummy area by maintaining regularity of alternating arrangements of pixel array groups and driving circuits for driving the groups in the dummy area.

Additional features and aspects will be set forth in the description that follows, and in part will be apparent from the description, or may be learned by practice of the inventive concepts provided herein. Other features and aspects of the inventive concepts may be realized and attained by the structure particularly pointed out in the written description, or derivable therefrom, and the claims hereof as well as the appended drawings.

To achieve these and other aspects of the inventive concepts, as embodied and broadly described herein, a deformed display device includes a display area including a plurality of pixel array areas in which a plurality of pixel array groups are arranged and a plurality of circuit areas in which a plurality of driving circuits are arranged, wherein the pixel array groups and the driving circuits form a pixel block; and a dummy area disposed at one side of the display area and including a plurality of dummy pixel array areas in which a plurality of dummy pixel array groups are arranged and a plurality of dummy circuit areas in which a plurality of dummy circuits are arranged, wherein the dummy pixel array groups and the dummy circuits do not form the pixel block.

In another embodiment, a deformed display device comprises a display area including a plurality of pixel array areas in which a plurality of pixel array groups are arranged and a plurality of circuit areas in which a plurality of driving circuits are arranged, wherein a first number of the pixel array groups and the first number of the driving circuits form a pixel block; and a dummy area disposed at one side of the display area and including a plurality of dummy pixel array areas in which a plurality of dummy pixel array groups are arranged and a plurality of dummy circuit areas in which a plurality of dummy circuits are arranged, wherein a second number of the dummy pixel array groups and the second number of the dummy circuits are arranged at one end of a row of display area panel, the second number being smaller than the first number.

It is to be understood that both the foregoing general description and the following detailed description are exemplary and explanatory and are intended to provide further explanation of the inventive concepts as claimed.

BRIEF DESCRIPTION OF THE DRAWINGS

The accompanying drawings, which are included to provide a further understanding of the present disclosure and which are incorporated in and constitute a part of this application, illustrate embodiments of the disclosure and together with the description serve to explain various principles of the present disclosure. In the drawings.

DETAILED DESCRIPTION

Reference will now be made in detail to embodiments of the disclosure, examples of which are illustrated in the accompanying drawings.

Figure 1:
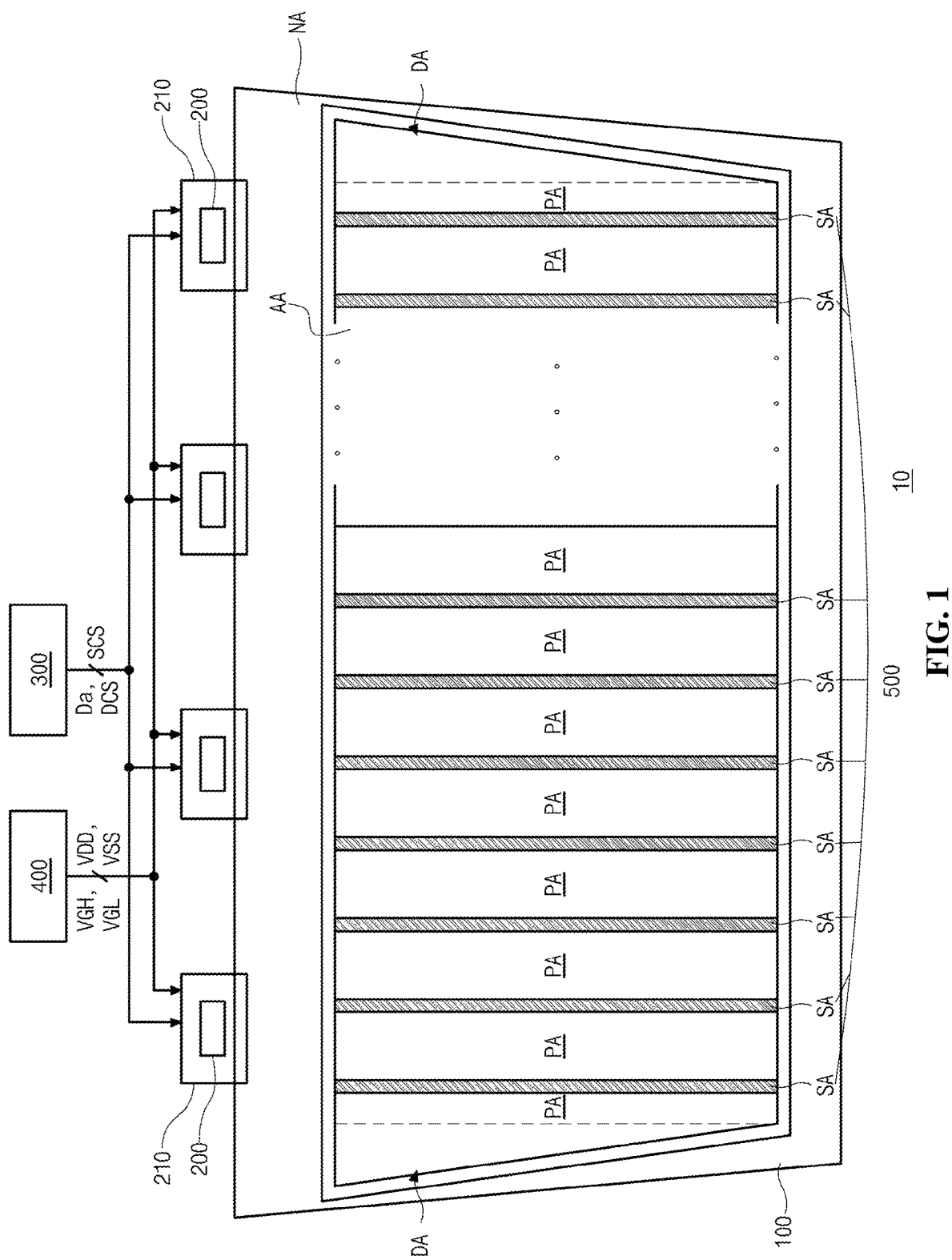
FIG. 1 is a schematic view of a deformed display device according to an embodiment of the present disclosure.

FIG. 1 is a schematic view of a deformed display device according to an embodiment of the present disclosure.

Figure 2:
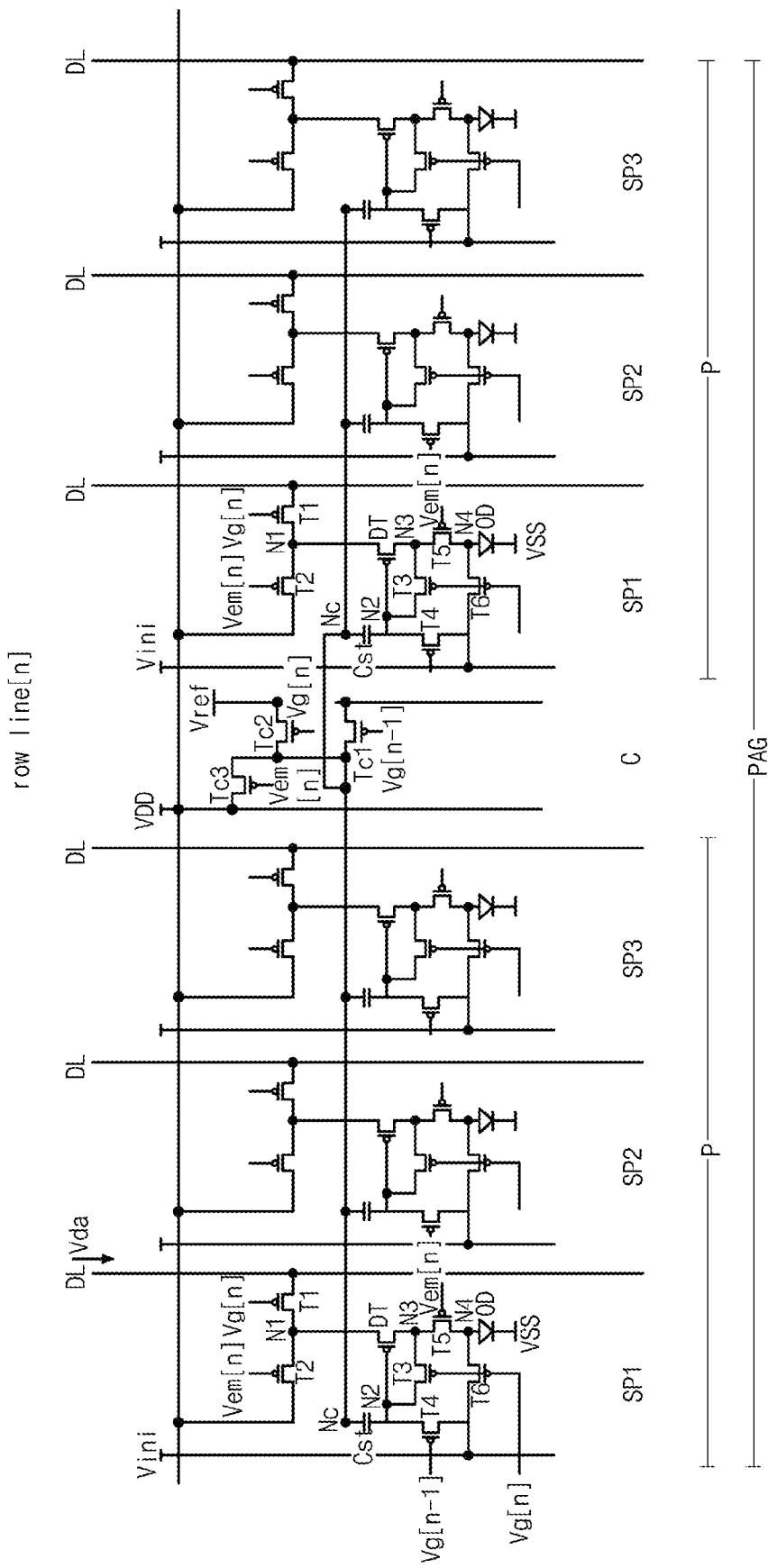
FIG. 2 is a view illustrating an example of the structure of a pixel and a common control circuit block in a pixel array group according to the embodiment of the present disclosure.

In FIG. 1, the deformed display device 10 according to the embodiment of the present disclosure can include a display panel 100 including a plurality of pixels P of FIG. 2 arranged in a matrix form and a panel driving circuit for driving the display panel 100.

Here, the panel driving circuit for driving the display panel 100 can include a data driving circuit 200, a scan driving circuit 500, a timing control circuit 300, and a power supply circuit 400.

The display panel 100 may be a liquid crystal display panel or an organic light-emitting diode display panel. However, the present disclosure is not limited thereto, and the display panel 100 can be another type of display panel capable of controlling the amount of light transmitted by a thin film transistor.

The display panel 100 can include a display area AA (or active area) where the pixels P of FIG. 2 are disposed on a substrate to display an image and a non-display area NA (or inactive area) surrounding the display area AA.

The pixels P of FIG. 2 disposed in the display area AA can be arranged in a matrix form, and each pixel P can include a plurality of sub-pixels SP1, SP2, and SP3 of FIG. 2 emitting light of different colors. For example, each pixel P of FIG. 2 can include a red sub-pixel R, a green sub-pixel G, and a blue sub-pixel B arranged adjacent to each other along a row line direction, that is, a horizontal direction in the context of the figure.

Here, the plurality of pixels P of FIG. 2 arranged along the row line direction is defined as each pixel array group PAG of FIG. 2. The pixel array group PAG of FIG. 2 will be described in more detail later.

Meanwhile, in the deformed display device 10 according to the embodiment of the present disclosure, the display area AA can have a deformed shape (or free form) different from a typical rectangular shape.

That is, the display area AA can be formed in a deformed shape such as a circular shape, an oval shape, a polygonal shape, or the like. Accordingly, the boundary between the display area AA and the non-display area NA can also have various shapes such as a circular arc, an elliptical arc, a curved line, an oblique line, or the like rather than having a straight line shape.

The display area AA can include an upper side, a lower side, a left side, and a right side. In addition, at least one of the four sides of the display area AA may not have the straight line shape. Further, a portion of the at least one of the four sides of the display area AA may have a curvature or a curved shape.

Moreover, in the display panel 100, various signal lines for transmitting driving signals can be formed on the substrate to drive the pixels P of FIG. 2 (or the sub-pixels SP1, SP2, and SP3 of FIG. 2).

A plurality of data lines DL of FIG. 2 for transmitting a data signal (or data voltage Vda), which is an image signal, can extend in a column line direction (vertical line or first direction) and each can be connected to the sub-pixels SP1, SP2, and SP3 of FIG. 2 of the corresponding column line.

In addition, a plurality of gate lines for transmitting a gate signal can extend in the row line direction (horizontal direction or second direction) and each can be connected to the sub-pixels SP1, SP2, and SP3 of FIG. 2 of the corresponding row line.

An emission line for transmitting an emission signal can extend in the column line and be parallel to the data lines DL and each can be connected to the sub-pixels SP1, SP2, and SP3 of FIG. 2 of the corresponding column line.

The timing control circuit 300 can control the driving timing of the data driving circuit 200 and the scan driving circuit 500. The timing control circuit 300 can process the digital data signal Da input from the external system according to the optical characteristics of the display panel 100 and supply the processed digital data signal Da to the data driving circuit 200.

Further, the timing control circuit 300 can generate data control signals DCS for controlling the driving timing of the data driving circuit 200 and scan control signals SCS for controlling the driving timing of the scan driving circuit 500 base on timing signals such as a vertical synchronization signal, a horizontal synchronization signal, a clock signal, and a data enable signal input from the external system.

The power supply circuit 400 can generate and supply various voltages for driving components of the deformed display device 10. The power supply circuit 400 can generate and output first and second logic voltages VGL and VGH (or low logic voltage and high logic voltage) for driving the scan driving circuit 500 and first and second power supply voltages VSS and VDD (or low potential driving voltage and high potential driving voltage) for driving the display panel 100.

The data driving circuit 200 can drive the data lines DL of FIG. 2. The data driving circuit 200 can convert the digital data signal Da to the analog data signal (i.e., data voltage Vda) based on the data control signal DCS and can provide the data voltage Vda to the corresponding data line DL of FIG. 2.

The data driving circuit 200 can be configured in the form of an integrated circuit (IC). In addition, the data driving circuit 200 can include at least one driving IC. In the embodiment of the present disclosure, a case in which a plurality of driving ICs is provided is shown as an example.

Meanwhile, each driving IC can be mounted on a flexible circuit film 210 and be connected to the display panel 100. As another example, each driving IC can be directly mounted on the substrate of the display panel 100 in the form of chip-on-glass (COG).

In the flexible circuit film 210, lines can be provided on the outside of the driving IC to transmit the control signal SCS for driving the scan driving circuit 500, the voltages VGL and VGH, and the voltages VSS and VDD for driving the display panel 100 toward the display panel 100

The scan driving circuit 500 can drive by outputting the corresponding scan signals to the gate line and the emission line. The scan driving circuit 500 can generate the scan signals based on the scan control signals SCS and supply the scan signals to the corresponding signal lines. For example, the scan driving circuit 500 can generate a gate signal and an emission signal and supply the signals to the corresponding signal lines.

The scan driving circuit 500 can output the gate signal to the gate line in a line sequential manner and output the emission signal to the emission line in a line sequential manner.

The scan driving circuit 500 can be directly formed on the substrate of the display panel 100 in a gate-in-panel (GIP) type.

The deformed display device 10 according to the embodiment of the present disclosure is characterized in that the scan driving circuit 500 is not formed in the non-display area NA and is formed to be dispersed in the display area AA.

As shown in FIG. 1, the display area AA can include a plurality of pixel array areas PA and a plurality of circuit areas SA. The pixel array areas PA are areas in which the pixels P of FIG. 2 are arranged. The circuit areas SA are areas which each are disposed between adjacent pixel array areas PA and constitute the scan driving circuit 500.

The plurality of pixels P of FIG. 2 arranged in the matrix form can be disposed in each pixel array area PA. In addition, the pixel array areas PA can substantially display the image. The pixel array areas PA can be parallel to each other and extend in the column line direction and can be spaced apart from each other with the circuit area SA interposed therebetween along the row line direction.

Further, each circuit area SA can be disposed between adjacent pixel array areas PA.

Moreover, some circuits constituting the scan driving circuit 500 can be formed in the circuit areas SA. The circuit areas SA can be parallel to each other and extend in the column line and can be spaced apart from each other with the pixel array area PA interposed therebetween along the row line direction.

In the deformed display device 10 according to the embodiment of the present disclosure, the circuit areas SA are dispersedly arranged in the display area AA, so that the pixel array areas PA, which are actual image display areas, are configured to have a divided shape. That is, the pixel areas PA are divided and separated by the circuit areas SA.

Accordingly, since it is not necessary to form the scan driving signal 500 in the non-display area NA by forming the scan driving circuit 500 for generating the scan signals in the display area AA, the width of the non-display area NA can be reduced. Therefore, it is possible to effectively realize the narrow bezel in which the width of the non-display area NA is reduced in the display device 10.

By forming the driving circuits, which are a unit circuit for generating the scan signals, in the plurality of circuit areas SA, respectively, the deviation of the scan signals according to the position based on the row line direction of the display area AA can be decreased.

Therefore, the uniformity of driving characteristics in the entire display area AA is improved, thereby increasing the display qualities. For example, the plurality of circuit areas SA are spaced apart from each other in the row line direction, and the driving circuits are formed in the respective circuit areas SA, so that the deviation of the scan signals generated along the row line direction of the display area AA can be reduced.

In the deformed display device 10 according to the embodiment of the present disclosure, since the display area AA is configured as a free form, lengths are not the same and are different depending on the location with respect to the row line direction and/or the column line direction.

That is, the horizontal resolution and/or the vertical resolution can be different depending on the location.

Referring to this in detail with reference to FIG. 1, the lengths of the display area AA in the row line direction may not be the same as a whole but may be different, and the lengths of the display area AA in the column line direction may also not be the same as a whole but may be different.

As described above, since the display area AA has the deformed shape, the lengths of all row lines may not be the same and may be different depending on the location. Accordingly, the numbers of the pixel array areas PA and the circuit areas SA disposed on the row line may be different depending on the location.

For example, at least four pixel array areas PA and at least four circuit areas SA may be arranged on the row line disposed at a relatively upper side. On the other hand, only one to three pixel array areas PA may be located on the row line disposed at a relatively lower side, and only one to three circuit areas SA may also be located on the row line disposed at a relatively lower side.

Figure 4:
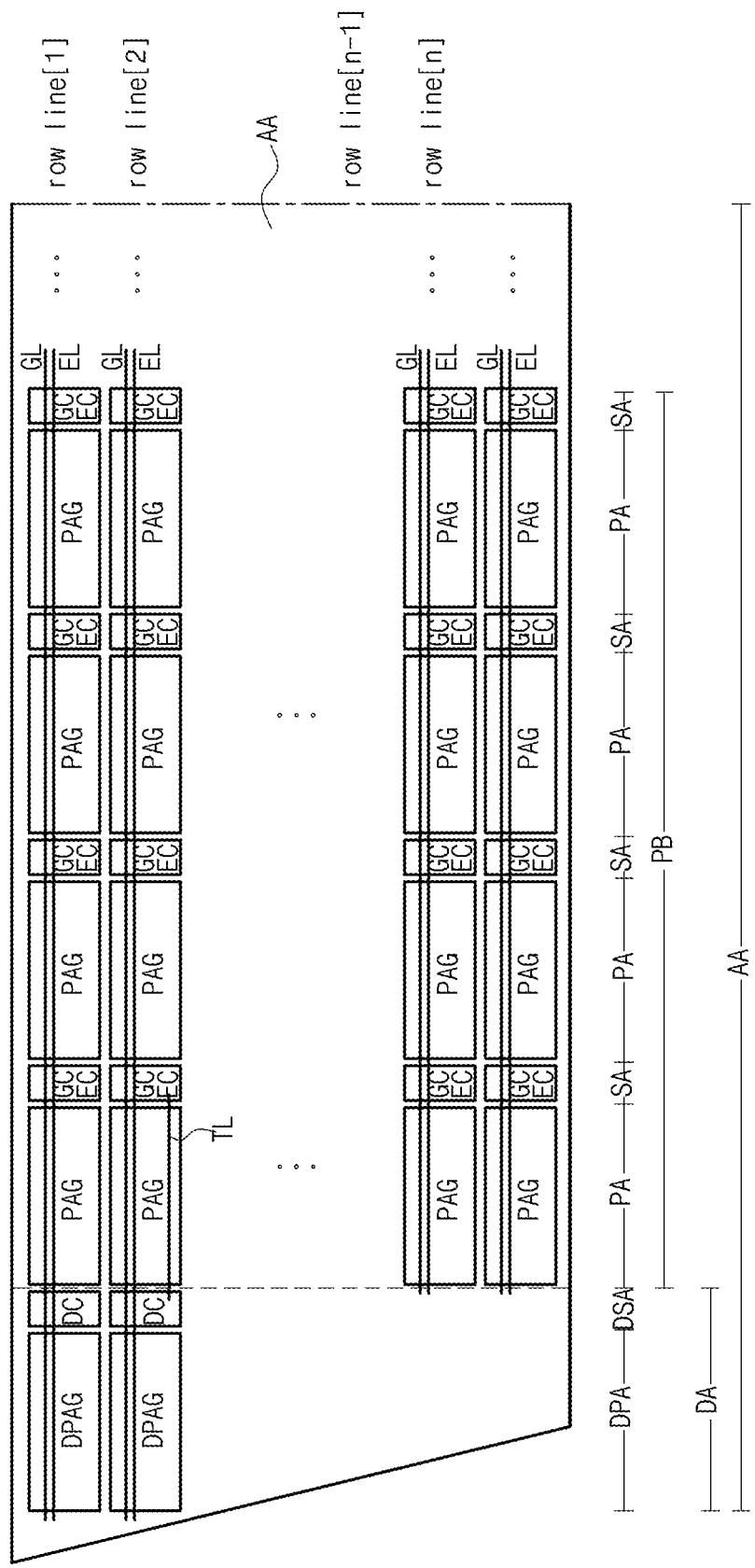
FIG. 4 is a schematic view illustrating an example of the arrangement of a gate signal generating circuit and an emission signal generating circuit of a scan driving circuit of the deformed display device according to the embodiment of the present disclosure.

Accordingly, referring to FIG. 4, the numbers of the pixel array areas PA and the circuit areas SA disposed on the first row line (row line [1]) may be different from the numbers of the pixel array areas PA and the circuit areas SA disposed on the nth row line (row line [n])(n is a natural number).

Figure 3:
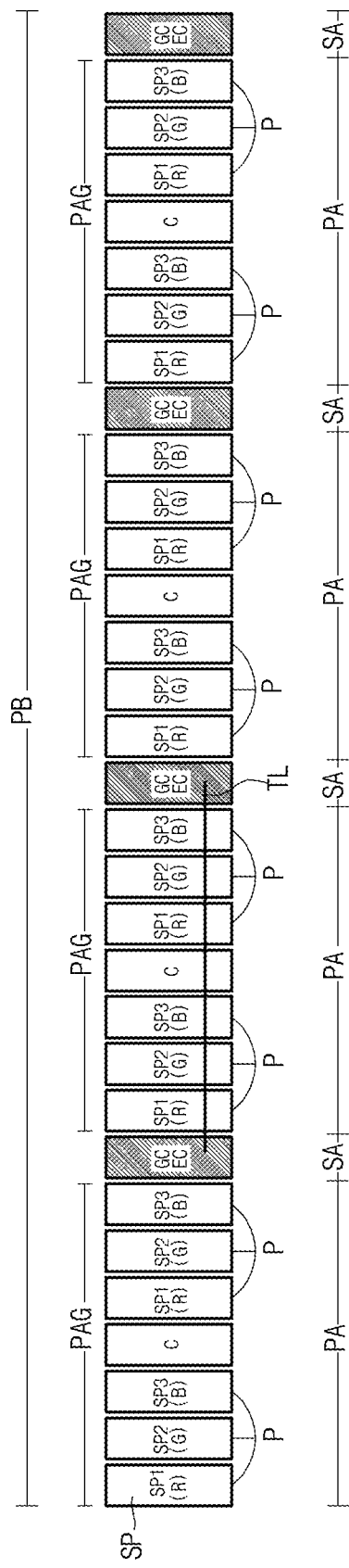
FIG. 3 is a schematic view illustrating the configuration of a pixel block according to the embodiment of the present disclosure.

Therefore, the numbers of the pixel array groups PAG of FIG. 3 and the driving circuits GC and EC of FIG. 3 may be different depending on the location of the row line.

Here, the pixel array groups PAG of FIG. 3 and the driving circuits GC and EC of FIG. 3 constitute a minimum unit to form a pixel block PB of FIG. 3. However, as shown in FIG. 1, the pixel array groups PAG of FIG. 3 and the driving circuits GC and EC of FIG. 3 do not constitute a minimum unit depending on the location of the row line, so that a dummy area DA where the pixel block PB of FIG. 3 is not implemented may be formed.

In the present disclosure, the dummy area DA is defined as an area in which the pixel block PB is not implemented. In addition, since the dummy area DA is disposed in the display area AA, the image is also displayed in the dummy area DA. Therefore, the term of 'dummy' is not interpreted to mean that it is not driven or no signal is applied.

The deformed display device 10 according to the embodiment of the present disclosure can prevent the display qualities from being decreased by the dummy area DA in which the pixel block PB of FIG. 3 is not implemented.

This will be described in more detail with reference to FIG. 2 and FIG. 3.

FIG. 2 is a view illustrating an example of the structure of a pixel and a common control circuit block in a pixel array group according to the embodiment of the present disclosure, and FIG. 3 is a schematic view illustrating the configuration of a pixel block according to the embodiment of the present disclosure.

In addition, FIG. 4 is a schematic view illustrating an example of the arrangement of a gate signal generating circuit and an emission signal generating circuit of a scan driving circuit of the deformed display device according to the embodiment of the present disclosure.

Figure 5:
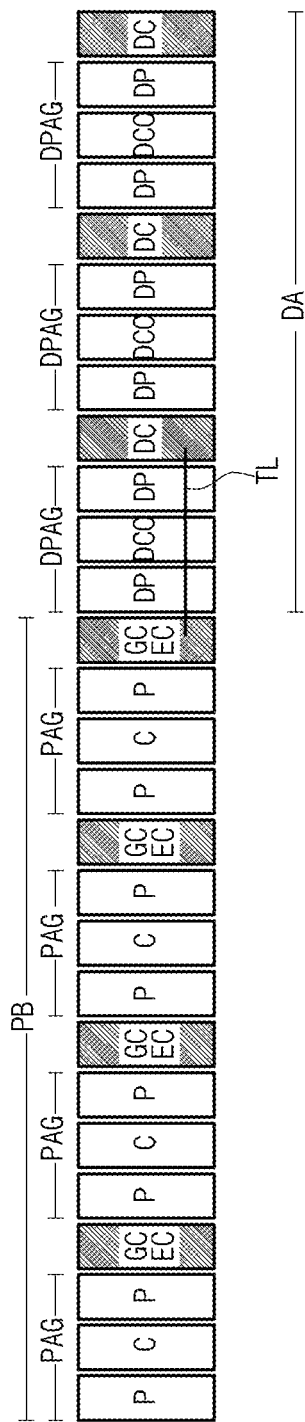
FIG. 5 is a schematic view illustrating a dummy pixel array group according to the embodiment of the present disclosure.

Further, FIG. 5 is a schematic view illustrating a dummy pixel array group according to the embodiment of the present disclosure.

As shown in FIG. 2, the pixel array group PAG according to the embodiment of the present disclosure can be configured to include a plurality of pixels P arranged along the row line direction and a common control circuit block C disposed between adjacent pixels P.

Here, for convenience of explanation, the pixel array group PAG is described as including two pixels P adjacent to each other along the row line and one common control circuit block C disposed therebetween as an example.

Each pixel P can comprise a plurality of sub-pixels SP1, SP2, and SP3 being adjacent to each other along the row line direction and emitting light of different colors. For example, the pixel P can include a first sub-pixel SP1 of red, a second sub-pixel SP2 of green, and a third sub-pixel SP3 of blue.

In addition, the common control circuit block C, which is provided between the pixels P, is commonly connected to the first, second, and third sub-pixels SP1, SP2, and SP3 of the pixels P to commonly control storage capacitors of the sub-pixels SP1, SP2, and SP3.

Here, an internal compensation structure can be applied to compensate the threshold voltages of driving transistors DT of the sub-pixels SP1, SP2, and SP3, and in this regard, a structure of 7T1C is exemplified for each sub-pixel SP1, SP2, and SP3.

Each sub-pixel SP1, SP2, and SP3 can include first, second, third, fourth, fifth, and sixth transistors T1, T2, T3, T4, T5, and T6 of switching transistors, a driving transistor DT, and a storage capacitor Cst as driving elements. Further, each sub-pixel SP1, SP2, and SP3 can include a light-emitting diode OD, which is an emission element driven by the driving elements.

Here, the transistors T1 to T6 and DT of the sub-pixel SP1, SP2, and SP3 may be P-type transistors. Alternatively, the transistors T1 to T6 and DT of the sub-pixel SP1, SP2, and SP3 may be N-type transistors.

Otherwise, the transistors T1 to T6 and DT of the sub-pixel SP1, SP2, and SP3 may be mixed to be P-type transistors and N-type transistors. For example, the driving transistor DT may be an N-type transistor, and the switching transistors T1 to T6 may be P-type transistors. Alternatively, the driving transistor DT may be a P-type transistor, and the switching transistors T1 to T6 may be N-type transistors.

The first transistor T1 may have a gate electrode connected to a gate line of an nth row line as a corresponding row line, a source electrode connected to a corresponding data line DL, and a drain electrode connected to a first node N1, that is, a drain electrode of the second transistor T2 and a source electrode of the driving transistor DT.

The first transistor T1 may be turned on to correspond to a gate signal Vg[n] of the corresponding nth row line. Accordingly, a data signal Vda provided through the data line DL may be applied to the first node N1.

The second transistor T2 may have a gate electrode connected to an emission line of the corresponding nth row line, a source electrode receiving a high potential driving voltage VDD of a second power supply voltage, and the drain electrode connected to the first node N1.

The second transistor T2 may be turned on to correspond to the emission signal Vem[n] of the corresponding nth row line. Accordingly, the high potential driving voltage VDD may be applied to the first node N1.

The third transistor T3 may have a gate electrode connected to the gate line of the corresponding nth row line, a source electrode connected to the drain electrode of the driving transistor DT and a source electrode of the fifth transistor, that is, a third node N3, and a drain electrode connected to the gate electrode of the driving transistor DT and a first electrode of the storage capacitor Cst, that is, a second node N2.

The third transistor T3 may be turned on to correspond to the gate signal Vg[n] of the corresponding nth row line. Accordingly, the driving transistor DT may be in a diode connection state.

The fourth transistor T4 may have a gate electrode connected to a gate line of the previous (n−1)th row line, a source electrode receiving an initialization voltage Vini, and a drain electrode connected to the second node N2.

The fourth transistor T4 may be turned on to correspond to the gate signal Vg[n−1] of the (n−1)th row line. Accordingly, the second node N2, that is, the gate electrode of the driving transistor DT may be initialized with the initialization voltage Vini.

The fifth transistor T5 may have a gate electrode connected to the emission line of the corresponding nth row line, the source electrode connected to the third node N3, and a drain electrode connected to the light-emitting diode OD and a drain electrode of the sixth transistor T6, that is, a fourth node N4.

The fifth transistor T5 may be turned on to correspond to the emission signal Vem[n] of the corresponding nth row line. Accordingly, the fifth transistor T5 applies the emission driving currents generated through the driving transistor DT to the light-emitting diode OD, so that the light-emitting diode OD can emit light.

The sixth transistor T6 may have a gate electrode connected to the gate line of the corresponding nth row line, a source electrode receiving the initialization voltage Vini, and the drain electrode connected to the fourth node N4.

The sixth transistor T6 may be turned on to correspond to the gate signal Vg[n] of the corresponding nth row line. Accordingly, the fourth node N4, that is, the light-emitting diode OD may be initialized with the initialization voltage Vini.

The storage capacitor Cst may include the first electrode connected to the second node N2 and a second electrode connected to a common control node Nc. The common control node Nc may be connected to a voltage output terminal of the common control circuit block C.

The common control circuit block C may be commonly connected to the common control nodes Nc of the sub-pixels SP1, SP2, and SP3 of the pixel P. The sub-pixels SP1, SP2, and SP3 of the pixel P may be controlled by commonly receiving the voltage output from the output terminal of the common control circuit block C.

The common control circuit block C may include a plurality of switching transistors. For example, the common control circuit block C may include first, second, and third common control transistors Tc1, Tc2, and Tc3.

Here, it is described as an example that the first, second, and third common control transistors Tc1, Tc2, and Tc3 are P-type transistors. As another example, the transistors Tc1, Tc2, and Tc3 of the common control circuit block C may be N-type transistors.

The first common control transistor Tc1 and the second common control transistor Tc2 may be connected in parallel. Accordingly, the first common control transistor Tc1 may have a gate electrode connected to the gate line of the previous (n−1)th row line, a source electrode receiving a reference voltage Vref, and a drain electrode connected to the output terminal of the common control circuit block C, that is, the common control node Nc of the sub-pixel SP1, SP2, and SP3.

The second common control transistor Tc2 may have a gate electrode connected to the gate line of the corresponding nth row line, a source electrode receiving the reference voltage Vref, and a drain electrode connected to the output terminal of the common control circuit block C, that is, the common control node Nc of the sub-pixel SP1, SP2, and SP3.

At this time, the first common control transistor Tc1 may be turned on according to the gate signal Vg[n−1] of the (n−1)th row line. Accordingly, the first common control transistor Tc1 may output the reference voltage Vref.

The second common control transistor Tc2 may be turned on according to the gate signal Vg[n] of the nth row line. Accordingly, the second common control transistor Tc2 may output the reference voltage Vref.

Like this, during the horizontal period of the previous row line and the horizontal period of the current row line, the common control circuit block C may operate to output the reference voltage Vref.

The third common control transistor Tc3 may have a gate electrode connected to the emission line of the corresponding nth row line, a source electrode receiving the high potential driving voltage VDD, and a drain electrode connected to the output terminal of the common control circuit block C, that is, the common control node Nc of the sub-pixel SP1, SP2, and SP3.

In this case, the third common control transistor Tc3 may be turned on according to the emission signal Vem[n] of the nth row line. Accordingly, the common control transistor Tc3 may output the high potential driving voltage VDD.

The deformed display device 10 of FIG. 1 according to the embodiment of the present disclosure can compensate the deviation of the threshold voltages Vth of the driving transistors DT and also compensate the deviation of the high potential driving voltage VDD.

The voltage may be dropped according to the line transmitting the high potential driving voltage VDD in the display panel 100 of FIG. 1, and there may be the deviation of the high potential driving voltage VDD depending on the location.

In the embodiment of the present disclosure, by commonly controlling the voltage charged to the storage capacitor Cst using the common control circuit block C, the component of the high potential driving voltage VDD can be removed in generating the emission driving currents.

Accordingly, it is possible to prevent the emission deviation due to the deviation of the high potential driving voltage VDD, and the display quality can be secured through this.

In addition, to compensate the deviation of the high potential driving voltage VDD, the common control circuit block C is provided on the basis of the pixel P, thereby performing common control, and thus the number of the control circuits can be reduced in comparison with the case where the control circuit is provided on the basis of the sub-pixels SP1, SP2, and SP3.

Further, the threshold voltage Vth can be directly detected from the data signal Vda, and the electrical short between the high potential driving voltage VDD and the reference voltage Vref can be prevented in the process of driving. Accordingly, the detection performance of the threshold voltage Vth can be improved.

Here, referring to FIG. 3, the plurality of pixels P arranged along the row line direction are provided in the pixel array group PAG of each pixel array area PA, and the common control circuit block C is disposed between adjacent pixels P, so that the common control circuit block C can be commonly connected to all the pixels P disposed at both sides thereof, that is, all the first, second, and third sub-pixels SP1, SP2, and SP3 of each of the two pixels P.

Moreover, the driving circuits GC and EC of the circuit area SA can be formed between adjacent pixel array groups PAG.

In the arrangement of each row line, the pixel array groups PAG of the pixel array area PA and the driving circuits GC and EC of the circuit area SA can be alternately arranged. In each pixel array group PAG of the pixel array area PA, two pixels P can be disposed adjacent to each other with the common control circuit block C interposed therebetween.

Therefore, the circuit area SA can be disposed between adjacent two pixels P like the common control circuit block C. Thus, the driving circuits GC and EC of the circuit area SA can be disposed between the adjacent two pixels P like the common control circuit block C.

Here, the common control circuit block C can be formed with substantially the same width as the circuit area SA.

According to the embodiment of the present disclosure, the area that can be allocated as the area for the common control circuit block C can be used as the circuit area SA, so that it is not necessary to provide an additional area for the scan driving circuit 500 of FIG. 1 in the display area AA.

A transmission line TL for transmitting the signal can be disposed between the adjacent circuit areas SA. When the driving circuits GC and EC are separately provided in the adjacent circuit areas SA or are not provided additionally, the signal can be transmitted through the transmission line TL disposed between the adjacent circuit areas SA.

Here, the pixel array areas PA and the circuit areas SA can be determined as a minimum unit, which is referred to as the pixel block PB, considering the number of thin film transistors and the voltage charged to the storage capacitor Cst in the pixel array group PAG.

Referring to FIG. 3, four pixel array areas PA and four circuit areas SA can form the minimum unit of one pixel block PB. For example, in the display device according to the embodiment of the present disclosure, the pixel array groups PAG of the four pixel array areas PA and the driving circuits GC and EC of the four circuit areas SA form one pixel block PB.

However, the present disclosure is not limited thereto, the number of pixel array groups PAG and the number of signal generating circuits GC and EC can be varied depending the characteristics of the display device.

Meanwhile, as stated above, the deformed display device 10 of FIG. 1 according to the embodiment of the present disclosure can have different lengths along the row line direction. Accordingly, the numbers of the pixel array areas PA and the circuit areas SA disposed in the respective row lines can be different depending on the location.

There may be the dummy area DA where the pixel array groups PAG of the pixel array area PA and the driving circuits GC and EC of the circuit areas SA do not form the pixel block PB depending on the location of the row line. In the dummy area DA that does not form the pixel block PB, the driving circuits GC and EC do not operate properly, so that the driving circuits GC and EC are not needed.

Looking at this in more detail, as shown in FIG. 4, the pixel array areas PA and the circuit areas SA may be alternately arranged in each row line of the display area AA. The circuit area SA may be disposed between adjacent pixel array areas PA.

The driving circuits GC and EC including the gate signal generating circuit GC and the emission signal generating circuit EC are disposed in the circuit area SA between the pixel array areas PA. At this time, first, second, third, and fourth pixel array areas PA and first, second, third, and fourth circuit areas SA form one pixel block PB. Each of the first, second, third, and fourth circuit areas SA may be disposed between adjacent pixel array areas PA.

Referring to FIG. 4, first, second, third, and fourth pixel array groups PAG and first, second, third, and fourth driving circuits GC and EC form one pixel block PB. The first, second, third, and fourth pixel array groups PAG and the first, second, third, and fourth driving circuits GC and EC alternate each other. The first, second, and third driving circuits GC and EC each are disposed between adjacent two of the first, second, third, and fourth pixel array groups PAG of the pixel block PB, and the fourth driving circuits GC and EC are disposed between the pixel array groups PAG of adjacent pixel blocks PB.

In the deformed display device 10 of FIG. 1 according to the embodiment of the present disclosure, since the display area AA is configured as a free form, the dummy area DA that does not form the pixel block PB is formed based on the row line.

The dummy area DA may include a dummy pixel array area DPA. In addition, a plurality of dummy pixel array groups DPAG may be arranged in the dummy pixel array area DPA along the row line direction. In FIG. 4, one dummy pixel array group DPAG is disposed in the dummy pixel array area DPA along the row line direction, but is not limited thereto.

The dummy pixel array group DPAG may include a plurality of dummy pixels DP arranged along the row line direction. A dummy common control circuit block DCC may be disposed between adjacent dummy pixels DP. Further, the dummy pixel DP may be disposed at both sides of the dummy common control circuit block DCC.

The dummy pixel DP may include a plurality of dummy sub-pixels (not shown) arranged in the matrix form and emitting light of different colors. For example, each dummy pixel DP may include a red dummy sub-pixel, a green dummy sub-pixel, and a blue dummy sub-pixel arranged adjacent to each other along each row line direction.

The dummy common control circuit block DCC commonly controls the dummy sub-pixels of the dummy pixel DP adjacent thereto.

At this time, the dummy pixel array group DPAG receives the signals from the gate signal generating circuit GC and the emission signal generating circuit EC of the pixel block PB adjacent thereto.

Accordingly, an additional gate signal generating circuit GC and an additional emission signal generating circuit EC may not be provided at one side of the dummy pixel array group DPAG. This may mean that additional driving circuits for applying the scan signals to the dummy pixel array group DPAG are not needed in the dummy area DA.

Since the additional driving circuits for applying the scan signals to the dummy pixel array group DPAG are not provided in the dummy area DA, a circuit area for the additional driving circuits may not be required in the dummy area DA. However, the present disclosure is not limited thereto.

For example, the deformed display device 10 of FIG. 1 according to the embodiment of the present disclosure is characterized in that a dummy circuit area DSA is further provided in the dummy area DA.

The deformed display device 10 of FIG. 1 according to the embodiment of the present disclosure may further include a dummy circuit DC of the dummy circuit area DSA arranged at one side of the dummy pixel array group DPAG in the dummy area DA.

Accordingly, in the deformed display device 10 of FIG. 1 according to the embodiment of the present disclosure, it is possible to maintain the regularity in which the dummy pixel array group DPAG of the dummy pixel array area DPA and the dummy circuit DC of the dummy circuit area DSA for driving it are alternately arranged even in the dummy area DA.

Therefore, the display quality can be prevented from being lowered due to the dummy area DA.

More specifically, according to the deformed shape of the display device, in the dummy area DA that does not form the pixel block PB (four pixel array groups PAG and four driving circuits GC and EC) of the minimum unit, only the dummy pixel array group DPAG may be arranged without the circuit area SA in which the signal generating circuits for driving the dummy pixel array group DPAG of the dummy pixel array area DPA are disposed.

However, in this case, since the regularity in which the pixel array groups PAG and the driving circuits GC and EC are alternately arranged in the display area AA is broken, one side or both sides of the dummy pixel array group DPAG of the dummy pixel array area DPA in the dummy area DA disposed in the display area AA, in which the driving circuits GC and EC should be disposed, can be recognized as a stain.

On the other hand, the deformed display device 10 of FIG. 1 according to the embodiment of the present disclosure may further include the dummy circuit area DSA at one side of the dummy pixel array area DPA in the dummy area DA. For example, the dummy circuit DC of the dummy circuit area DSA may be further disposed at the one side of the dummy pixel array group DPAG of the dummy pixel array area DPA in the dummy area DA.

Accordingly, the dummy pixel array area DPA and the dummy circuit area DSA can be alternately arranged even in the dummy area DA of the display area AA as the pixel array area PA and the circuit area SA are alternately arranged.

As shown in FIG. 4, the pixel array group PAG of the pixel array area PA and the driving circuits (the gate signal generating circuit GC and the emission signal generating circuit EC) of the circuit area SA may be alternately arranged. Further, in the dummy area DA, the dummy pixel array group DPAG of the dummy pixel array area DPA and the dummy circuit DC of the dummy circuit area DSA may be alternately arranged.

Therefore, even in the dummy area DA, although four dummy pixel array groups DPAG and four dummy pixels DC are not provided like the pixel block PB, the dummy pixel array group DPAG and the dummy circuit DC are alternately arranged, so that the regularity of the arrangement can be maintained.

Referring to FIG. 5, the deformed display device 10 of FIG. 1 according to the embodiment of the present disclosure can have the regularity in which the pixel array groups PAG and the driving circuits GC and EC are alternately arranged and also have the regularity in which the dummy pixel array group DPAG and the dummy circuit DC are alternately arranged in the dummy area DA.

The plurality of pixels P arranged along the row line direction is provided in each pixel array group PAG, and the common control circuit block C is disposed between adjacent pixels P, so that the pixels P are disposed at both sides of the common control circuit block C, respectively.

The driving circuits GC and EC of the circuit area SA are disposed between adjacent pixel array groups PAG, thereby having the regularity in which the pixel array groups PAG and the driving circuits GC and EC are alternately arranged.

Additionally, even in the dummy area DA that does not form the pixel block PB of the minimum unit for driving the display device, the dummy pixel array group DPAG and the dummy circuit DC (dummy driving circuit) are alternately arranged, so that the regularity can be maintained.

The dummy pixel array group DPAG may include the plurality of dummy pixels DP arranged along the row line direction, and the dummy common control circuit block DCC may be disposed between adjacent dummy pixels DP. Further, the dummy pixels DP are disposed at both sides of the dummy common control circuit block DCC, respectively.

Accordingly, in the display device according to the embodiment of the present disclosure, the dummy pixel array group DPAG and the dummy circuit DC can be alternately arranged in the dummy area DA of the display area AA such that the regularity in which the pixel array groups PAG and the driving circuits GC and EC are alternately arranged can be maintained. Therefore, since the stain may be prevented from being recognized at one side or both sides of the dummy pixel array group DPAG in the dummy area DA of the display area AA, it is possible to prevent the decrease in the display qualities due to the dummy area DA.

Figure 6:
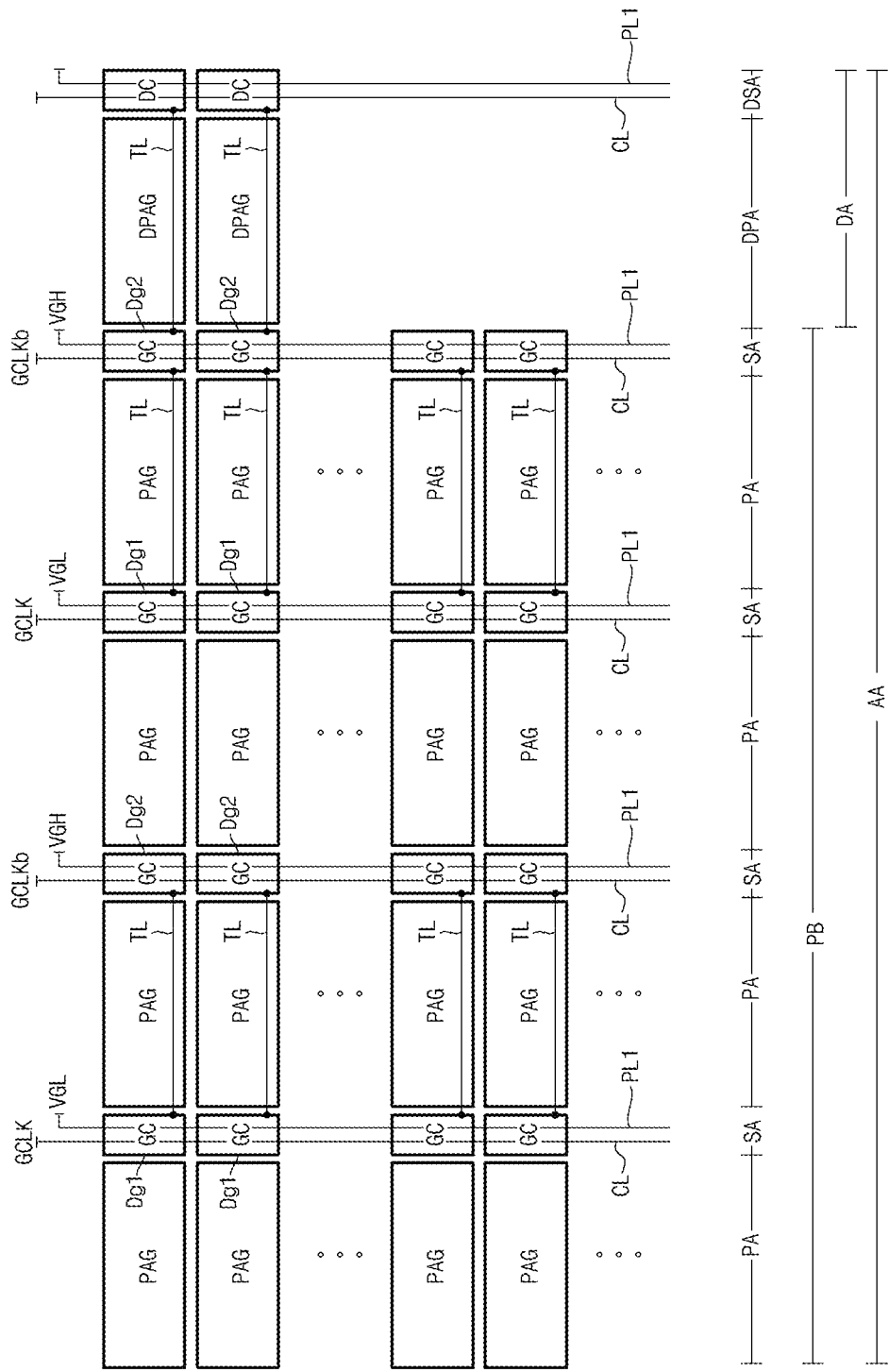
FIG. 6 is a schematic view of signal lines formed along a circuit area where a driving circuit is disposed and a dummy circuit area where a dummy circuit is disposed according to the embodiment of the present disclosure.
Figure 7:
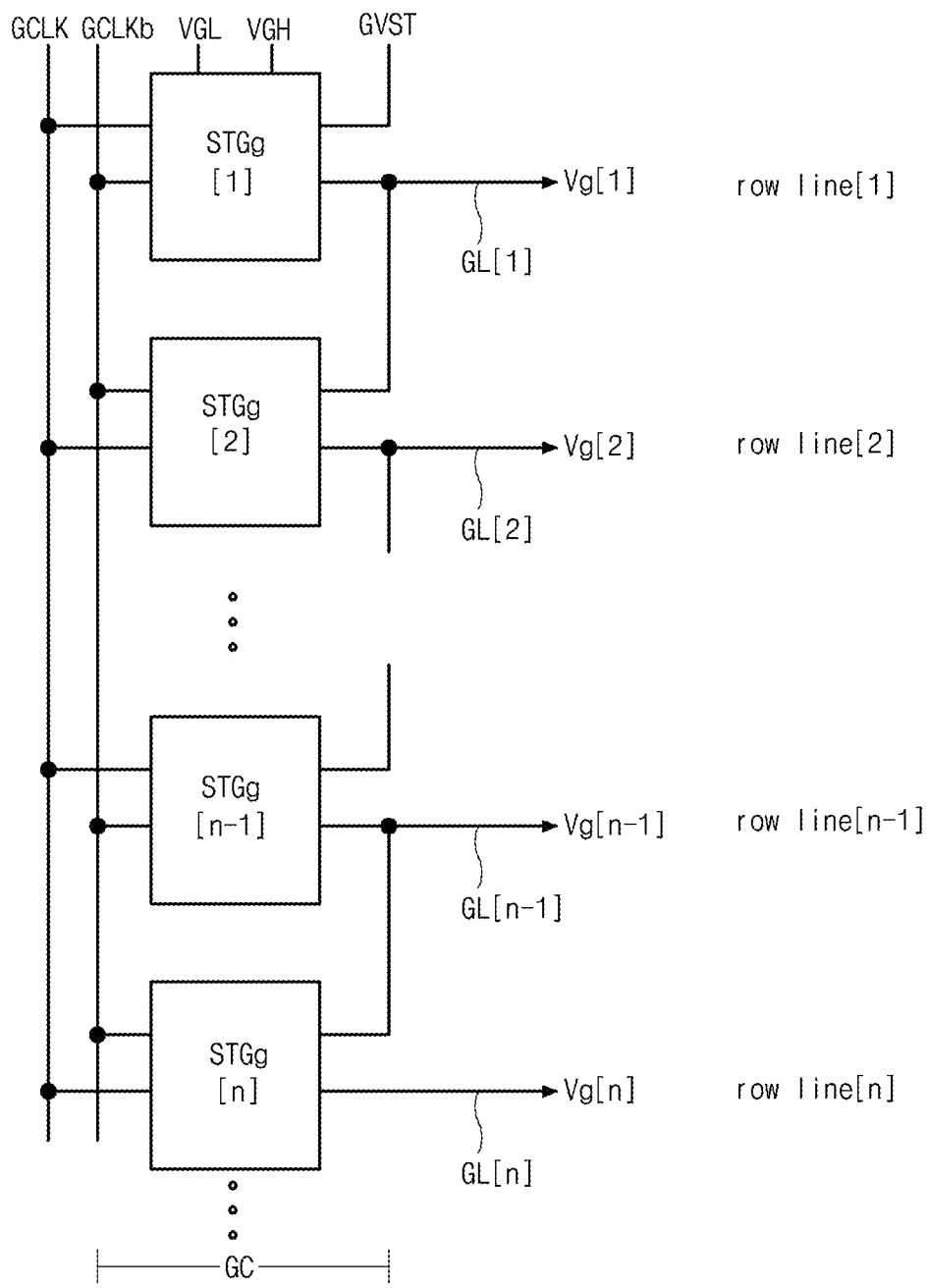
FIG. 7 is a schematic view showing a conceptual configuration of a gate signal generating circuit in the driving circuit of FIG. 6.

FIG. 6 is a schematic view of signal lines formed along a circuit area where a driving circuit is disposed and a dummy circuit area where a dummy circuit is disposed according to the embodiment of the present disclosure, and FIG. 7 is a schematic view showing a conceptual configuration of a gate signal generating circuit in the driving circuit of FIG. 6.

Figure 8A:
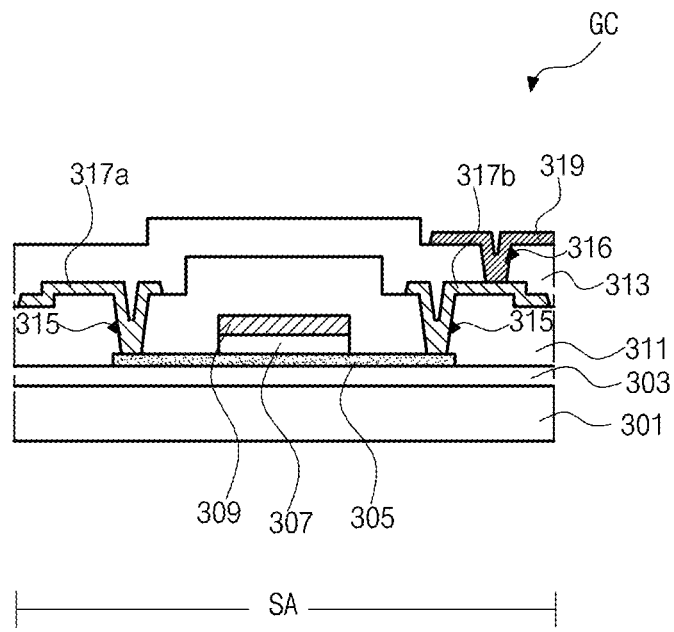
FIG. 8A is a schematic view of a thin film transistor in the circuit area.
Figure 8B:
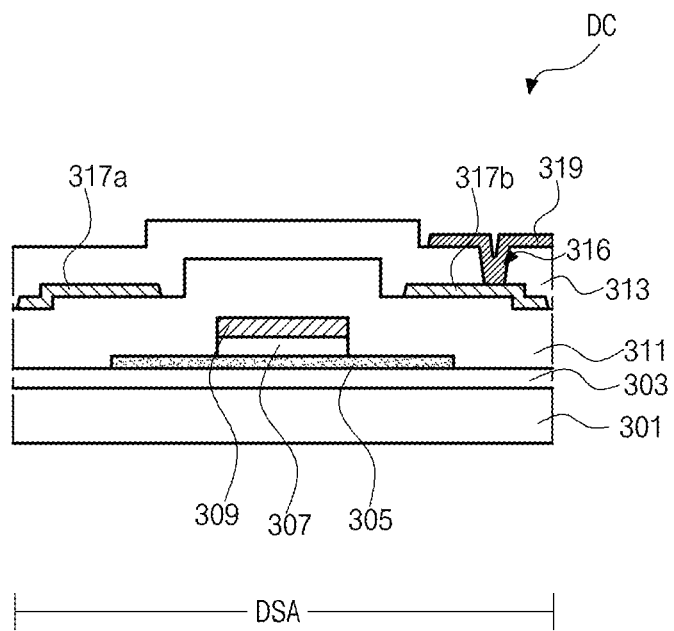
FIG. 8B is a schematic view of a thin film transistor in the dummy circuit area.

FIG. 8A is a schematic view of a thin film transistor in the circuit area, and FIG. 8B is a schematic view of a thin film transistor in the dummy circuit area.

Figure 9:
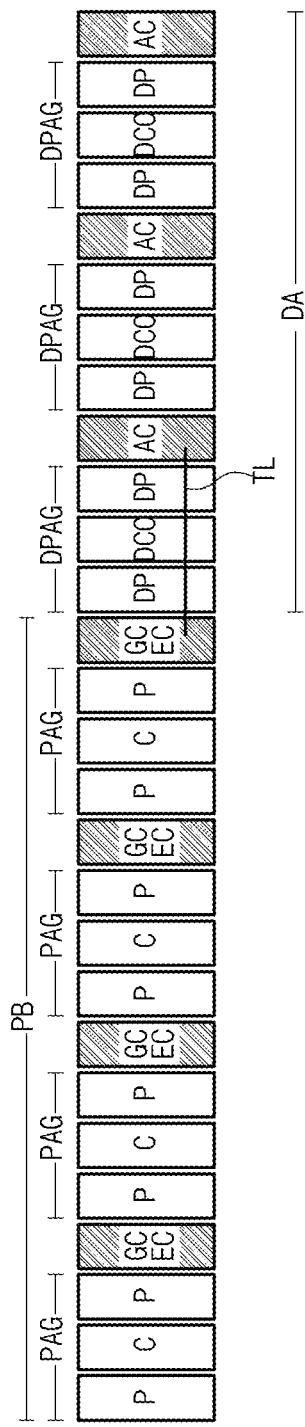
FIG. 9 is a schematic view of a circuit area where a driving circuit is disposed and a dummy circuit area where a dummy circuit is disposed according to another embodiment of the present disclosure.

FIG. 9 is a schematic view of a circuit area where a driving circuit is disposed and a dummy circuit area where a dummy circuit is disposed according to another embodiment of the present disclosure.

As shown in FIG. 6, a clock signal line CL for transmitting gate clock signals GCLK and GCLKb and a first power supply line, that is, a first voltage line PL1 for transmitting logic voltages VGL and VGH may be formed in the circuit area SA disposed in the display area AA along a column line direction in which the circuit area SA extends.

The clock signal lines CL for respectively transmitting first and second gate clock signals GCLK and GCLKb may be disposed in different circuit areas SA. For example, the clock signal line CL for transmitting the first gate clock signal GCLK may be disposed in the circuit area SA in which a first circuit portion Dg1 of a stage STGg is formed, and the clock signal line CL for transmitting the second gate clock signal GCLKb may be disposed in the circuit area SA in which a second circuit portion Dg2 of the stage STGg is formed.

The first voltage lines PL1 for respectively transmitting first and second logic voltages VGL and VGH may be disposed in different circuit areas SA. For example, the first voltage line PL1 for transmitting the first logic voltage VGL may be disposed in the circuit area SA in which the first circuit portion Dg1 of a stage STGg is formed, and the first voltage line PL1 for transmitting the second logic voltage VGH may be disposed in the circuit area SA in which the second circuit portion Dg2 of the stage STGg is formed.

The gate signal generating circuit GC may include a plurality of stages STGg dependently connected to each other to sequentially generate corresponding gate signals Vg to a plurality of row lines. In addition, each stage STGg may include a plurality of transistors and at least one capacitor and output the gate signal Vg that is a scan signal.

That is, each stage STGg may include a Q transistor and a Qb transistor, which are connected in series with an output node (or an output terminal) connected to the corresponding gate line GL interposed therebetween, and a control circuit for controlling the switching operation of the Q transistor and the Qb transistor.

The Q transistor may output the gate signal Vg of the turn-on level to the gate line GL, and the Qb transistor may output the gate signal Vg of the turn-off level to the gate line GL. For example, when the switching transistor of the sub-pixel connected to the gate line GL is P-type, the Q transistor may output a low-level gate signal and the Qb transistor may output a high-level gate signal.

In addition, each stage STGg may receive the output of the gate signal Vg of the previous stage STGg and use it as a start signal. Here, the stage STGg[1] of the first row line may receive a separate start signal GVST.

Further, the stage STGg may receive the first and second gate clock signals GCLK and GCLKb of different phases as the clock signals and the first and second logic voltages which are logic voltages of opposite phases.

The stage STGg may output the corresponding gate clock signal as the gate signal Vg through the Q transistor during the horizontal period of the corresponding row line. For example, the first stage STGg[1] may output the first gate clock signal GCLK as the gate signal Vg[1] through the corresponding Q transistor, and the second stage STGg[2] may output the second gate clock signal GCLKb as the gate signal Vg[2] through the corresponding Q transistor.

In addition, the stage STGg may output the first logic voltage VGL or the second logic voltage VGH, as a voltage of the turn-off level, as the gate signal Vg through the Qb transistor after the horizontal period. For example, when the switching transistor of the sub-pixel connected to the gate line GL is P-type, the second logic voltage VGH, which is a high logic voltage, may be output as the gate signal Vg.

In this case, the dummy circuit DC including a plurality of stages may be disposed in the dummy circuit area DSA located in the dummy area DA. The dummy circuit DC disposed in the dummy circuit area has the same configuration as the gate signal generating circuit GC disposed in the circuit are SA, but no signal is substantially applied thereto and/or output therefrom.

The dummy circuit DC disposed in the dummy circuit area DSA does not apply the signal to the dummy pixel DP of the dummy pixel array group DPAG in the dummy area DA, so that the signal line may be configured separately or the signal line may not be connected to the stage such that no signal is applied and/or output.

The gate signal generating circuit GC disposed in the circuit area SA may include a plurality of stages STGg of FIG. 2 connected to the gate lines, and each stage STGg of FIG. 2 may include a plurality of thin film transistors.

As shown in FIG. 8A, the thin film transistor disposed in the circuit area SA may include a buffer layer 303 deposited on a substrate 301, an oxide semiconductor (active layer) 305 deposited on the buffer layer 303, a gate insulation layer 307 deposited on the oxide semiconductor 305, and a gate electrode 309 deposited on the gate insulation layer 307. In addition, an insulation layer 311 may be formed on the gate electrode 309 to cover the oxide semiconductor 305, the gate insulation layer 307, and the gate electrode 309.

First contact holes 315 may be provided in the insulation layer 311. Source and drain electrodes 317a and 317b disposed on the insulation layer 311 may be electrically connected to the oxide semiconductor 305 through the first contact holes 315.

A passivation layer 313 may be disposed on the source and drain electrodes 317a and 317b, and a metal layer 319 disposed on the passivation layer 313 may be electrically connected to the drain electrode 317b through a second contact hole 316 provided in the passivation layer 313.

The metal layer 319 may be electrically connected to various types of power supplies. Alternatively, the metal layer 319 may be electrically connected to the output terminal to which the scan signal is output from the stage STGg of FIG. 2.

As shown in FIG. 8B, the thin film transistor of the dummy circuit DC disposed in the dummy circuit area DSA may include all of a buffer layer 303, an oxide semiconductor 305, a gate insulation layer 307, a gate electrode 309, an insulation layer 311, source and drain electrodes 317a and 317b, a passivation layer 313, and a metal layer 319 like the thin film transistor of the gate signal generating circuit GC.

However, unlike the insulation layer 311 provided in the thin film transistor of the gate signal generating circuit GC, the insulation layer 311 provided in the thin film transistor of the dummy circuit DC has a difference that the first contact holes 315 are not provided therein.

Accordingly, the source and drain electrodes 317a and 317b of the thin film transistor disposed in the dummy circuit DC are not electrically connected to the oxide semiconductor 305, so that no signal is substantially applied to and/or output from the dummy circuit DC disposed in the dummy circuit area DSA.

Here, although it has been described as an example that the insulation layer 311 does not include the first contact holes 315 exposing the oxide semiconductor 305, the second contact hole 316, which is provided in the passivation layer 313 and exposes the drain electrode 317b, may be omitted.

Like this, the dummy circuit DC of the dummy circuit area DSA may be disposed at one side or both sides of the dummy pixel array group DPAG disposed in the dummy pixel array area DPA of the dummy area DA.

The dummy circuit DC of the dummy circuit area DSA has the same configuration as the gate signal generating circuit GC provided in the circuit area SA, but no signal is applied thereto and/or output therefrom.

In the deformed display device 10 of FIG. 1 according to the embodiment of the present disclosure, the dummy pixel array group DPAG and the dummy circuit DC may be alternately arranged even in the dummy area DA. Accordingly, the regularity in which the pixel array groups PAG and the driving circuits GC and EC are alternately arranged may be maintained with the dummy pixel array group DPAG and the dummy circuit DC even in the dummy area DA of the display area AA, so that the display qualities can be prevented from being lowered due to the dummy area DA.

In addition, although not shown in the figure, the emission signal generating circuit EC of FIG. 4 may be disposed in the circuit area SA, and the clock signal line CL transmitting the emission clock signal (not shown) may be disposed along the column line direction in which the circuit area SA extends.

At this time, the dummy circuit DC, which has the same configuration as the emission signal generating circuit EC of FIG. 4 but no signal applied to and/or output from, may be disposed in the dummy circuit area DSA located in the dummy area DA. Namely, no signal may be applied to the clock signal line CL disposed in the dummy circuit DC.

Here, as shown in FIG. 9, the auxiliary common control circuit block AC may be further disposed in the dummy circuit area DSA located in the dummy area DA. The auxiliary common control circuit block AC may have the same configuration as the dummy common control circuit block DCC disposed in the dummy pixel array group DPAG, but no signal may be substantially applied thereto and/or output therefrom.

That is, the auxiliary common control circuit block AC disposed in the dummy circuit area DSA does not output and apply the signal for controlling the storage capacitors Cst of FIG. 2 to the dummy pixels DP of the dummy pixel array group DPAG disposed in the dummy area DA.

To do this, the auxiliary common control circuit block AC may be configured such that the common control node Nc of FIG. 2 may not be connected to the drain electrodes of the first, second, and third common control transistors Tc1, Tc2, and Tc3 of FIG. 2 of the dummy sub-pixels of the dummy pixel DP.

Through this, the regularity in which the dummy pixel array group DPAG and the auxiliary common control circuit block AC are also alternately arranged may be maintained even in the dummy area DA.

Figure 10:
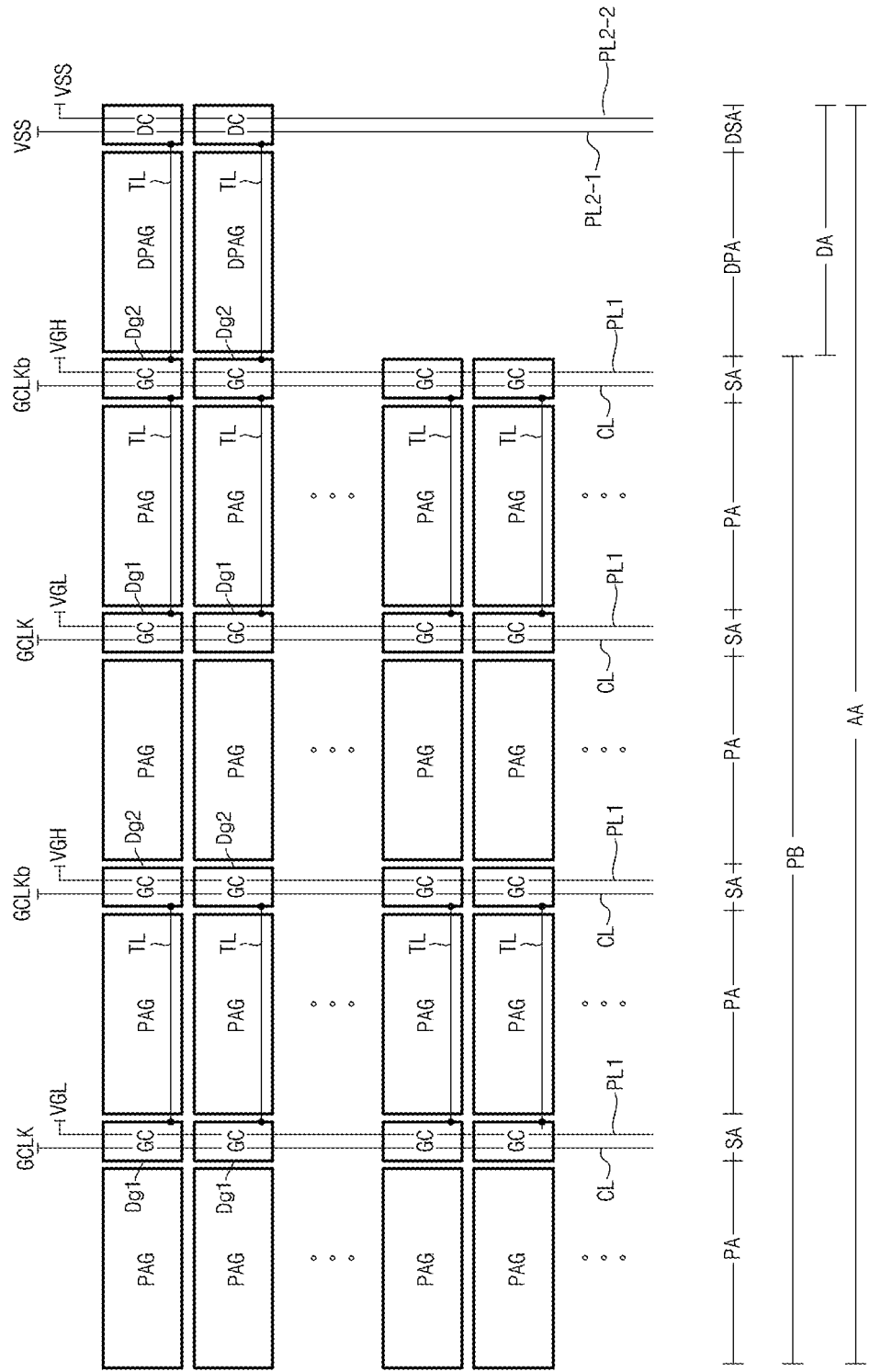
FIG. 10 is a schematic view of signal lines formed along a circuit area where a driving circuit is disposed and a dummy circuit area where a dummy circuit is disposed according to another embodiment of the present disclosure.

FIG. 10 is a schematic view of signal lines formed along a circuit area where a driving circuit is disposed and a dummy circuit area where a dummy circuit is disposed according to another embodiment of the present disclosure.

As shown in FIG. 10, the clock signal line CL for transmitting the gate clock signals GCLK and GCLKb and the first voltage line PL1 for transmitting the logic voltages VGL and VGH may be formed in the circuit area SA disposed in the display area AA along the column line direction in which the circuit area SA extends.

The clock signal lines CL for respectively transmitting the first and second gate clock signals GCLK and GCLKb may be disposed in different circuit areas SA. For example, the clock signal line CL for transmitting the first gate clock signal GCLK may be disposed in the circuit area SA in which the first circuit portion Dg1 of the stage STGg is formed, and the clock signal line CL for transmitting the second gate clock signal GCLKb may be disposed in the circuit area SA in which the second circuit portion Dg2 of the stage STGg is formed.

Similarly, the first voltage lines PL1 for respectively transmitting the first and second logic voltages VGL and VGH may be disposed in different circuit areas SA. For example, the first voltage line PL1 for transmitting the first logic voltage VGL may be disposed in the circuit area SA in which the first circuit portion Dg1 of a stage STGg is formed, and the first voltage line PL1 for transmitting the second logic voltage VGH may be disposed in the circuit area SA in which the second circuit portion Dg2 of the stage STGg is formed.

In addition, a second power supply line, that is, a second-first voltage line PL2-1 and a second-second voltage line PL2-2 for transmitting the low potential driving voltage VSS are disposed in the dummy circuit area DSA located in the dummy area DA.

At this time, the low potential driving voltage VSS is provided to the first circuit portion Dg1 through the second-first voltage line PL2-1, and the low potential driving voltage VSS is provided to the second circuit portion Dg2 through the second-second voltage line PL2-2.

Like this, by disposing the second-first and second-second voltage lines PL2-1 and PL2-2 for transmitting the low potential driving voltage VSS in the dummy circuit area DSA located in the dummy area DA, the regularity in which the pixel array groups PAG and the driving circuits are alternately arranged can be maintained even in the dummy area DA, so that the display qualities can be prevented from being lowered due to the dummy area DA.

Further, it is not necessary to form a wide power supply line in the non-display area NA for forming the second-first and second-second voltage lines PL2-1 and PL2-2 outside the display area AA, and the second-first and second-second voltage lines PL2-1 and PL2-2 formed in the display area AA can be substituted for the wide power supply line of the non-display area NA.

Accordingly, it is possible to reduce the width of the non-display area NA, thereby effectively realizing a narrow bezel. In addition, even if the display device has a large area, it is possible to effectively realize the narrow bezel while equalizing the low potential driving voltage VSS in the display area AA.

As described above, in the deformed display device according to the embodiment of the present disclosure, the dummy pixel array group DPAG of the dummy pixel array area DPA and the dummy circuit DC of the dummy circuit area DSA are provided in the dummy area DA, which does not form the pixel block PB, so that the regularity in which the pixel array groups PAG and the driving circuits GC and EC for driving them are alternately arranged can be maintained even in the dummy area DA.

Accordingly, it is possible to prevent the decrease in the display qualities, which may occur when the regularity in which the pixel array groups PAG and the driving circuits GC and EC for driving them are alternately arranged is broken and one side or both sides of the dummy pixel DP or the dummy pixel array group DPAG in the dummy area DA are recognized as a stain.

In addition, while the dummy pixel array group DPAG and the dummy circuit DC of the dummy circuit area DSA are alternately arranged such that the regularity is maintained even in the dummy area, the second-first and second-second voltage lines PL2-1 and PL2-2 transmitting the low potential driving voltage VSS are disposed in the dummy circuit area DSA, so that it is not necessary to form a separate power supply line outside the display area AA. Therefore, the display device according to the embodiment of the present disclosure can realize the narrow bezel.

In the deformed display device according to the present disclosure, the dummy circuit area is further provided in the dummy area, which does not form the pixel block, so that the regularity in which the pixel array groups and the driving circuits for driving them are alternately arranged can be maintained even in the dummy area.

Accordingly, the display qualities can be prevented from being lowered in the dummy area.

In addition, the second-first and second-second voltage lines transmitting the low potential driving voltage are disposed in the dummy circuit area, so that it is not necessary to form a separate power supply line outside the display area while the regularity in which the pixel array groups and the driving circuits are alternately arranged is maintained even in the dummy area. Therefore, the low potential driving voltage can be equalized, and the narrow bezel can also be realized.

It will be apparent to those skilled in the art that various modifications and variations can be made in the display device of the present disclosure without departing from the technical idea or scope of the disclosure. Thus, it is intended that the present disclosure cover the modifications and variations of this disclosure provided they come within the scope of the appended claims and their equivalents.

What is claimed is:

1. A deformed display device, comprising:
a display area including a plurality of pixel array areas in which a plurality of pixel array groups are arranged and a plurality of circuit areas in which a plurality of driving circuits are arranged, wherein the pixel array groups and the driving circuits form a pixel block; and
a dummy area disposed at one side of the display area and including a plurality of dummy pixel array areas in which a plurality of dummy pixel array groups are arranged and a plurality of dummy circuit areas in which a plurality of dummy circuits are arranged, wherein the dummy pixel array groups and the dummy circuits do not form the pixel block.

2. The deformed display device of claim 1, wherein the pixel array areas are disposed along each row line of a display panel, and the dummy pixel array areas are disposed along each row line of the display panel,
wherein each pixel array group includes a plurality of pixels and at least one common control circuit block disposed between adjacent pixels,
wherein each dummy pixel array group includes a plurality of dummy pixels and at least one dummy common control circuit block disposed between adjacent dummy pixels,
wherein each pixel includes a plurality of sub-pixels emitting light of different colors,
wherein each dummy pixel includes a plurality of dummy sub-pixels emitting light of different colors,
wherein the common control circuit block commonly controls the sub-pixels of the pixel adjacent thereto, and
wherein the dummy common control circuit block commonly controls the dummy sub-pixels of the dummy pixel.

3. The deformed display device of claim 2, wherein the dummy pixel array group receives a signal from the circuit area disposed in the pixel block through a transmission line.

4. The deformed display device of claim 1, wherein each of the driving circuit and the dummy circuit includes a clock signal line transmitting a clock signal and a first power supply line, and
wherein no signal is applied to the clock signal line in the dummy circuit.

5. The deformed display device of claim 1, wherein each of the driving circuit and the dummy circuit includes a clock signal line transmitting a clock signal and a first power supply line, and
wherein the dummy circuit includes a plurality of stages.

6. The deformed display device of claim 5, wherein the dummy circuit has a same configuration as a gate signal generating circuit of the driving circuit.

7. The deformed display device of claim 1, wherein the driving circuit includes a clock signal line transmitting a clock signal and a first power supply line,
wherein the dummy circuit includes a second power supply line, and wherein the first power supply line transmits a low logic voltage or a high logic voltage supplied to the driving circuit, and the second power supply line transmits a low potential driving voltage supplied to a cathode electrode of a light-emitting diode in the display area.

8. The deformed display device of claim 2, wherein the common control circuit block has a same width as the circuit area.

9. The deformed display device of claim 1, wherein a transmission line for transmitting a signal is provided between adjacent circuit areas.

10. The deformed display device of claim 2, wherein the common control circuit block of an nth row line (n is a natural number) includes:
   a first common control transistor connected to a gate line of an (n−1)th row line, receiving a reference voltage, and connected to an output terminal of the common control circuit block;
   a second common control transistor connected to a gate line of an nth row line, receiving the reference voltage, and connected to the output terminal of the common control circuit block; and
   a third common control transistor connected to an emission line of the nth row line, receiving a high potential driving voltage, and connected to the output terminal of the common control circuit block.

11. The deformed display device of claim 1, wherein a non-display area is provided at edges of the display area, and
   wherein at least a portion of a boundary between the display area and the non-display area has one of a circular shape, an elliptical shape, a curved shape, and an oblique shape.

12. The deformed display device of claim 1, wherein the pixel block is a minimum unit for driving a pixel and/or driving circuit.

13. A deformed display device, comprising:
   a display area including a plurality of pixel array areas in which a plurality of pixel array groups are arranged and a plurality of circuit areas in which a plurality of driving circuits are arranged, wherein a first number of the pixel array groups and the first number of the driving circuits form a pixel block; and
   a dummy area disposed at one side of the display area and including a plurality of dummy pixel array areas in which a plurality of dummy pixel array groups are arranged and a plurality of dummy circuit areas in which a plurality of dummy circuits are arranged, wherein a second number of the dummy pixel array groups and the second number of the dummy circuits are arranged at one end of a row of the display area, the second number being smaller than the first number.

14. The deformed display device of claim 13, wherein the pixel array areas are disposed along each row line of a display panel, and the dummy pixel array areas are disposed along each row line of the display panel,
   wherein each pixel array group includes a plurality of pixels and at least one common control circuit block disposed between adjacent pixels,
   wherein each dummy pixel array group includes a plurality of dummy pixels and at least one dummy common control circuit block disposed between adjacent dummy pixels,
   wherein each pixel includes a plurality of sub-pixels emitting light of different colors,
   wherein each dummy pixel includes a plurality of dummy sub-pixels,
   wherein the common control circuit block commonly controls the sub-pixels of the pixel adjacent thereto, and
   wherein the dummy common control circuit block commonly controls the dummy sub-pixels of the dummy pixel.

15. The deformed display device of claim 14, wherein the dummy pixel array group receives a signal from the circuit area disposed in the pixel block through a transmission line.

16. The deformed display device of claim 13, wherein each of the driving circuit and the dummy circuit includes a clock signal line transmitting a clock signal and a first power supply line, and
   wherein no signal is applied to the clock signal line in the dummy circuit.

17. The deformed display device of claim 13, wherein the driving circuit includes a clock signal line transmitting a clock signal and a first power supply line,
   wherein the dummy circuit includes a second power supply line, and
   wherein the first power supply line transmits a low logic voltage or a high logic voltage supplied to the driving circuit, and the second power supply line transmits a low potential driving voltage supplied to a cathode electrode of a light-emitting diode in the display area.

18. The deformed display device of claim 14, wherein the common control circuit block has a same width as the circuit area.

19. The deformed display device of claim 13, wherein a non-display area is provided at edges of the display area, and
   wherein at least a portion of a boundary between the display area and the non-display area has one of a circular shape, an elliptical shape, a curved shape, and an oblique shape.

20. The deformed display device of claim 13, wherein the pixel block is a minimum unit for driving a pixel and/or driving circuit.

* * * * *